(12) United States Patent
Ngai

(10) Patent No.: US 7,936,206 B2
(45) Date of Patent: May 3, 2011

(54) TRANSISTOR JUNCTION DIODE CIRCUITRY SYSTEMS AND METHODS

(75) Inventor: Wai Lim Ngai, Poway, CA (US)

(73) Assignee: Entropic Communications, Inc., San Diego, CA (US)

( * ) Notice: Subject to any disclaimer, the term of this patent is extended or adjusted under 35 U.S.C. 154(b) by 101 days.

(21) Appl. No.: 12/490,317

(22) Filed: Jun. 24, 2009

(65) Prior Publication Data

US 2010/0277230 A1    Nov. 4, 2010

Related U.S. Application Data

(60) Provisional application No. 61/174,813, filed on May 1, 2009.

(51) Int. Cl.
*H03K 3/01* (2006.01)
(52) U.S. Cl. .......................................... 327/534; 327/427
(58) Field of Classification Search .................. None
See application file for complete search history.

(56) References Cited

U.S. PATENT DOCUMENTS

| 5,387,848 A | 2/1995 | Wong |
| 6,130,572 A | 10/2000 | Ghilardelli et al. |

*Primary Examiner* — Lincoln Donovan
*Assistant Examiner* — Sibin Chen
(74) *Attorney, Agent, or Firm* — Bruce W. Greenhaus

(57) ABSTRACT

Methods and apparatus for capacitive voltage division are provided, an example apparatus having an input and an output and including a first switched capacitor circuit. In some embodiments, the capacitive voltage divider includes first and second MOSFETs. A first capacitor is coupled between the drain of the first MOSFET and the input to the capacitive voltage divider. A first circuit coupled to the drain of the first MOSFET is configured to pull down the drain of the first MOSFET and thus apply a reverse bias to a first junction diode internal to the first MOSFET between the drain and the bulk of the first MOSFET. A second capacitor is coupled between the source of the first MOSFET and the drain of the second MOSFET. A second circuit is configured to reverse bias a second junction diode between the drain and bulk of the second MOSFET.

14 Claims, 6 Drawing Sheets

TRANSISTOR JUNCTION DIODE CIRCUITRY SYSTEMS AND METHODS

CROSS-REFERENCE TO RELATED APPLICATIONS

This application claims priority to U.S. Provisional Patent Application No. 61/174,813, filed May 1, 2009, entitled Transistor Junction Diode Circuitry Systems and Methods.

TECHNICAL FIELD

The disclosed method and apparatus relates to transistor circuitry, and more particularly, some embodiments relate to junction diodes in transistor circuitry.

DESCRIPTION OF THE RELATED ART

A transistor is an electronic device, commonly made of semiconductor materials such as silicon (Si), germanium (Ge), gallium arsenide (GaAs), or silicon germanium (SiGe). Such devices are generally used to amplify or switch electrical signals. Some example types of transistors include bipolar junction transistors (BJTs) and field-effect transistors (FETs).

Transistors can be made from combinations of p-type and n-type semiconductor materials in various topologies, depending on the type of transistor. Junctions between the p-type and n-type semiconductor materials in the transistor form a diode (p-n junction). These diodes are non-linear devices that may negatively affect the operation of a transistor circuit.

One example transistor type is the metal-oxide-semiconductor field-effect transistor (MOSFET). The MOSFET is a common type of field effect transistor (FET) that may be used to amplify or switch electronic signals. Example p-channel 100 and n-channel 102 MOSFET layouts are illustrated in FIG. 1. The p-channel MOSFET 100 is commonly referred to as a PMOS transistor 100. Similarly, the n-channel MOSFET 102 is commonly referred to as an NMOS transistor 102. FIG. 1 illustrates the gates (G), sources (S), drains (D), and bulks (B) for each transistor 100 and 102. As this example illustrates, for n-channel MOSFET 102 the source S and drain D are formed by doping an n-type material in a p-type substrate. For the p-channel MOSFET 100, an n-well is created and the source S and drain D are formed by doping a p-type region in the n-well.

The resultant p-n junctions in MOSFETs 100, 102 form diode-like structures that result in a directionality of current flow. Such structures allow current to pass in one direction (in a forward biased mode) and block current in the opposite direction (in a reverse biased mode). Such p-n junctions do not operate as perfect rectifiers, but instead exhibit complex non-linear characteristics. Diode circuit representations $D_1$, $D_2$, $D_3$, $D_4$, and $D_5$ are superimposed on FIG. 1 to illustrate these diode structures that are formed when the MOSFET topology is used.

As one example circuit using MOSFETs, a series of MOSFETs can be used to switch capacitors in and out of a variable capacitance voltage divider. Such a circuit can be affected by the non-linearity of the various diodes ($D_1$-$D_5$) formed in the MOSFETs. The non-linear capacitance caused by the non-linearity of the diodes can cause the attenuation of the circuit, the input capacitance of the circuit, or both to change non-linearly.

FIG. 2 is a diagram of an idealized capacitive voltage divider 150 and is used to illustrate the general functionality of such devices. An example capacitive voltage divider 250 that uses MOSFETs as switching devices is discussed with respect to FIG. 4. A capacitive voltage divider 150 is a linear circuit that produces an output voltage $V_o$ as a fraction of its input voltage $V_i$. Referring now to FIG. 2, the example capacitive voltage divider 150 is formed by connecting two capacitors $C_1$ and $C_2$ in series. An input voltage $V_i$ can be applied across the series capacitance $C_1$ and $C_2$. The output voltage $V_o$ of the capacitive voltage divider 150 is the voltage across $C_2$. It can be shown that the output voltage, $V_o$, is related to the input voltage, $V_i$, by:

$$V_o = V_i \cdot \frac{C_1}{C_1 + C_2} \quad (1.1)$$

Capacitive voltage dividers 150 do not pass direct current input. The capacitive voltage divider 150 can, however, be used to perform a voltage divider function for an alternating current (AC) signal. For example, capacitive voltage dividers 150 might be used for gain control in a radio frequency (RF) system, including systems that handle broadband signals.

The capacitors $C_1$ and $C_2$ can be variable capacitors, as illustrated in FIG. 2. By varying the capacitance of capacitors $C_1$ and $C_2$ the attenuation of the circuit can be varied. The variable attenuation can be used to control gain in an RF system, for example.

It is generally preferable that the input capacitance of the capacitive voltage divider 150 be constant or nearly constant. The input capacitance of the capacitive voltage divider 150 is:

$$C_{in} = \frac{C_1 C_2}{C_1 + C_2} \quad (1.2)$$

Accordingly, in order to keep $C_{in}$ constant $C_1$ should increase as $C_2$ decreases. The converse is also true. Further, the changes in capacitance should be proportional to keep $C_{in}$ constant. It is noted that Equations 1.1 and 1.2 define $C_1$ and $C_2$ for a given attenuation and $C_{in}$.

FIG. 3 illustrates an idealized capacitive voltage divider 200 that can be formed using a capacitor bank rather than variable capacitors. In order to keep $C_{in}$ constant in a capacitor bank, the capacitance of the upper portion 202 should increase as the capacitance of the lower portion 204 decreases. The converse is also true. The capacitance of each portion 202 and 204 can be increased by switching in capacitors and decreased by switching out capacitors. Each of the capacitors within an upper 202 or lower 204 bank of capacitors may have the same capacitance or the capacitance of some or all of them can vary. The changes in capacitance can be proportional to keep $C_{in}$ constant. Accordingly, to maintain constant input capacitance, when an upper capacitor 202 is switched in a lower capacitor 204 can be switched out.

FIG. 4 illustrates an example capacitive voltage divider 250 that can be formed by implementing the switches of FIG. 3 with MOSFETs 256 and 258. The MOSFETs 256 and 258 can be configured such that when a capacitor in the upper portion 252 of the circuit is switched in, a corresponding capacitor in the lower portion 254 of the circuit is switched out. Likewise, MOSFETs 256 and 258 can be configured such that the converse is true.

The p-n junctions in the MOSFETs 256, 258 in the capacitive voltage divider of FIG. 4 form junction diodes. These diodes are illustrated in FIG. 4 by the diode representations 260, 262, and 264 attached to each MOSFETs 256, 258.

These diodes 260, 262, and 264 are not intended to represent external diodes connected to the MOSFETs, but rather, are intended to illustrate a phenomenon of the structure formed by the internal p-n junctions of each MOSFETs 256, 258. These diodes 260, 262, and 264 can cause non-linearity in the capacitive voltage divider 250 due to the non-linear capacitance of each diode 260, 262, and 264. Additionally, the n-well of the PMOS transistor 256 can add a large junction capacitance due to the generally large area between the n-well and the p-substrate.

Capacitive voltage dividers can have an impact on input capacitance. Accordingly, to allow reduced transistor sizes and decrease the junction capacitance, the capacitances used in the capacitive voltage divider are preferably generally low. The capacitance of the voltage divider, however, should preferably be much greater than the various non-linear junction capacitances of the junction diodes to reduce the effect of the junction capacitance. Also, the reactance of the capacitance should preferably be much larger than the turn-on resistance of the transistors to improve the Quality Factor of the divider. This can help to achieve lower losses or better noise figures.

SUMMARY OF DISCLOSED METHOD AND APPARATUS

Various embodiments of the disclosed method and apparatus for transistor junction-diode circuitry are presented. Some embodiments are directed toward capacitive voltage division circuitry having an input and an output and including at least a first switched capacitor circuit. According to one embodiment, the capacitive voltage divider includes: (1) a first metal-oxide-semiconductor field-effect transistor (MOSFET); (2) a first capacitor having a first and second terminal, the first terminal being coupled to the drain of the first MOSFET and the second terminal being coupled to the input to the capacitive voltage divider; (3) a first circuit coupled to the drain of the first MOSFET, the first circuit configured to pull down the drain of the first MOSFET, thus apply a reverse bias to a first junction diode internal to the first MOSFET, the first junction diode being between the drain and the bulk of the first MOSFET, the reverse bias being applied when the first MOSFET is off and the first circuit being coupled to short the first junction diode in the first MOSFET when the first MOSFET is on; (4) a second MOSFET; (5) a second capacitor having a first and second terminal, the first terminal of the second capacitor being coupled to the source of the first MOSFET and the second terminal of the second capacitor being coupled to the drain of the second MOSFET; and (6) a second circuit, configured to reverse bias a second junction diode being between the drain and bulk of the second MOSFET, the reverse bias being applied when the second MOSFET is off and the second circuit configured to short the first junction diode in the second MOSFET when the second MOSFET is on. In some embodiments, the first and second circuits are each implemented as a resistor. In other embodiments, the first circuit is a resistor and the second circuit is circuitry in another circuit stage.

In one embodiment, the first MOSFET comprises a p-channel MOSFET and the second MOSFET comprises an n-channel MOSFET. One MOSFET may be formed in a well of material that is opposite in semiconductor type to the substrate material. For example, if the substrate material is p-type semiconductor, then the well can be n-type semiconductor, providing an n-well.

Some embodiments include a second switched capacitor circuit. These embodiments may use a single well shared by one MOSFET in the first switched capacitor circuit and one MOSFET in the second switched capacitor circuit. When the substrate is p-type semiconductor material, the well can be formed using n-type semiconductor material to form an n-well. Other embodiments comprise a plurality of switched capacitor circuits. These embodiments may form a plurality of transistors using a single well of semiconductor material.

In one embodiment, a first capacitor in the first switch capacitor circuit and a first capacitor in the second switch capacitor circuit share a single capacitor plate. A second capacitor in the first switch capacitor circuit and a second capacitor in the second switch capacitor circuit can also share a single capacitor plate.

Other features and aspects of the disclosed method and apparatus will become apparent from the following detailed description, taken in conjunction with the accompanying drawings, which illustrate, by way of example, the features in accordance with embodiments of the disclosed method and apparatus. The summary is not intended to limit the scope of the invention, which is defined solely by the claims attached hereto.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

The disclosed method and apparatus relates to transistor circuitry, and more particularly, some embodiments relate to junction diodes in transistor circuitry. The junction diodes in the transistors can be reversed biased such that they operate in a more linear region than their forward biased counterparts. In such a region, the junction capacitance remains smaller and more constant. Additional features of some embodiments of the method and apparatus described herein are discussed with respect to example capacitive voltage divider circuits using MOSFET transistors. It will be understood by those of skill in the art, after reviewing the present application, that the method and apparatus described herein may be applied to other transistor circuits, including transistor circuits that use transistor types other than MOSFETs.

One embodiment of the disclosed method and apparatus performs voltage division and more particularly, capacitive voltage division. A capacitive voltage divider may be used for various applications including, for example, gain control. Such a capacitive voltage divider may be designed to have low input capacitance and can be configured such that the input capacitance remains constant or nearly constant over a wide gain control range. Generally, this can provide a constant or near constant loading to the circuitry driving the input of the capacitive voltage divider. A time varying input capacitance, on the other hand, might alter the characteristics of the driving stage, cause variations in the output voltage that are not proportional to variations of the input signal, or cause other undesired effects. In some embodiments, the capacitive arrays are controlled by complementary metal-oxide switches (CMOS) switches. These switches can include circuitry designed to reverse-bias both PMOS and NMOS junction diodes regardless of whether the MOSFETS are on or off. In addition, the n-wells of all PMOS switches can be tied together to minimize the n-well-diode's sidewall area. In one particular embodiment, this means that one n-well is shared (i.e., used for all of the PMOS switches). Decreasing the sidewall area may lower the overall n-well-diode capacitance, which is typically non-linear. Accordingly, decreasing this n-well-diode capacitance can improve the linearity of the capacitive voltage divider.

The apparatus and method described herein can be configured to provide a reverse-bias condition for some or all of the junction diodes in the capacitive voltage divider. Additionally, some examples can be configured to provide a zero-DC steady-state current consumption.

Figure 1:
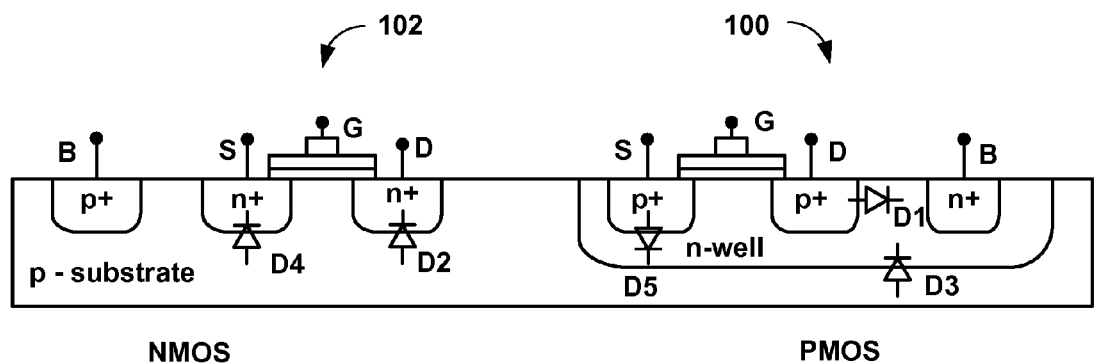
FIG. 1 illustrates example p-channel and n-channel MOSFET layouts.
Figure 2:
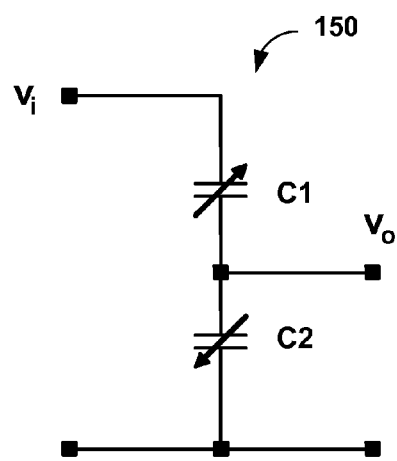
FIG. 2 illustrates the function of an idealized capacitive voltage divider.
Figure 3:
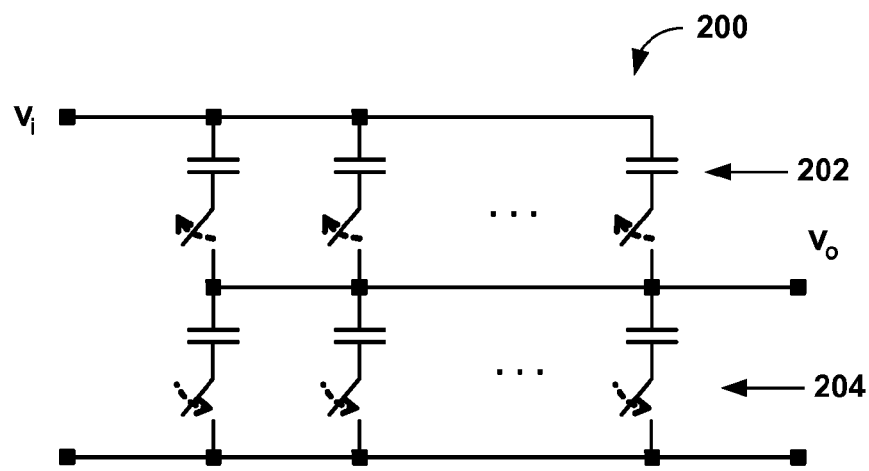
FIG. 3 illustrates a capacitive voltage divider comprising two idealized capacitor banks.
Figure 4:
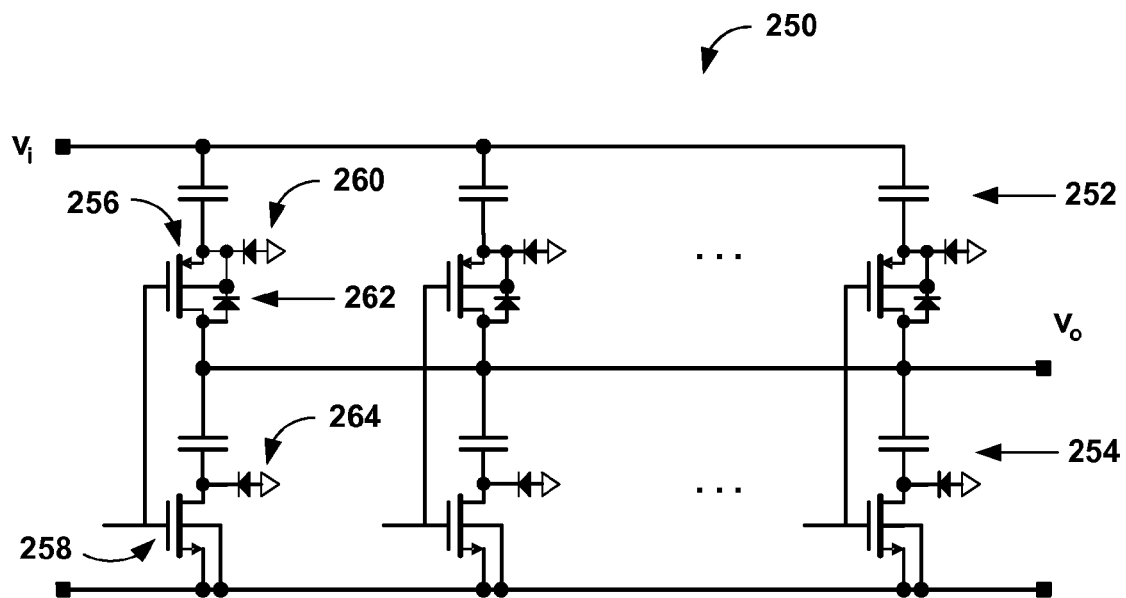
FIG. 4 illustrates an example capacitive voltage divider that can be formed by replacing the switches of FIG. 3 with MOSFETs.
Figure 5:
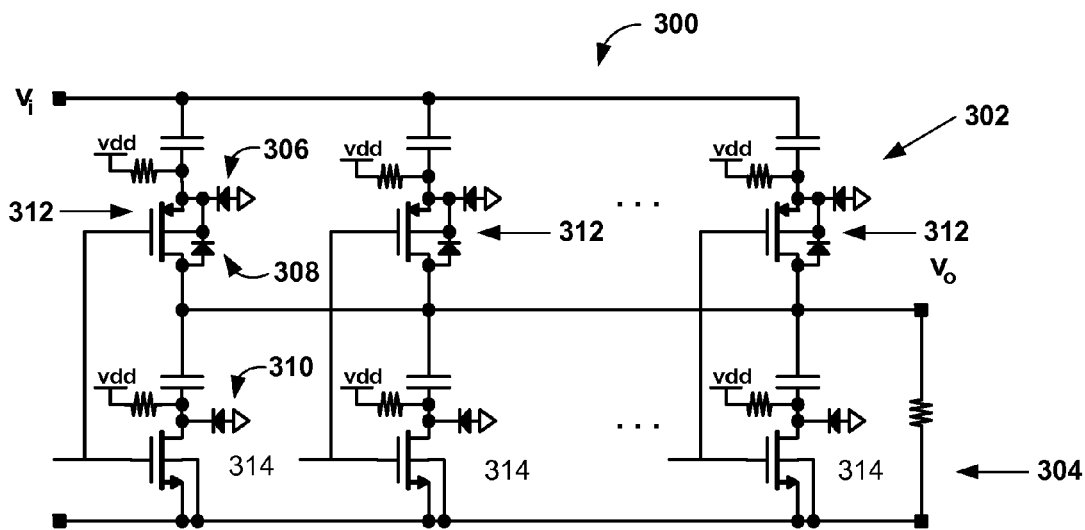
FIG. 5 illustrates an example MOSFET capacitive voltage divider having pull-up/down structure to bias junction diodes.

FIG. 5 illustrates an example MOSFET capacitive voltage divider 300 configured in accordance with the apparatus and methods described herein. The example capacitive voltage divider 300 illustrated in FIG. 5 uses MOSFETs 312, 314 to switch capacitors in and out of a capacitor bank. In this way, the capacitance of the upper 302 and lower 304 portions of the capacitive voltage divider can be varied. The MOSFETs can be connected such that when a capacitor in the upper portion 302 of the circuit is switched in, a corresponding capacitor in the lower portion 304 of the circuit is switched out. If the upper-bank capacitor and its lower-bank counterpart are proportional, a constant or near constant input capacitance may be achieved.

The p-n junctions in the MOSFETs in the capacitive voltage divider of FIG. 5 form junction diodes. These diodes are illustrated in FIG. 5 by the diode representations 306, 308, and 310 overlaid on each transistor. These diode representations 306, 308, and 310 are not intended to represent external diodes connected to the MOSFETs, but instead illustrate the electrical characteristics of the structure formed by the internal p-n junctions of each MOSFET. As illustrated in FIG. 5, these junction diodes 306, 308, and 310 are reverse-biased when a MOSFET is off, avoiding the non-linearity of the diode 306, 308, and 310. This also reduces the effects of non-linearities in the capacitive voltage divider due to the non-linear capacitance of each diode 306, 308, and 310. The junction diodes 306 and 308 in the PMOS MOSFETs 312 are not reverse-biased when the PMOS MOSFETs 312 are on, however. Accordingly, the non-linear effects of these MOSFETS 312 can affect the capacitive voltage divider by causing non-linear capacitance changes in the input capacitance and the capacitance of the upper portion of the capacitive voltage divider. Additionally, DC current flows when the MOSFETs are on.

Figure 6:
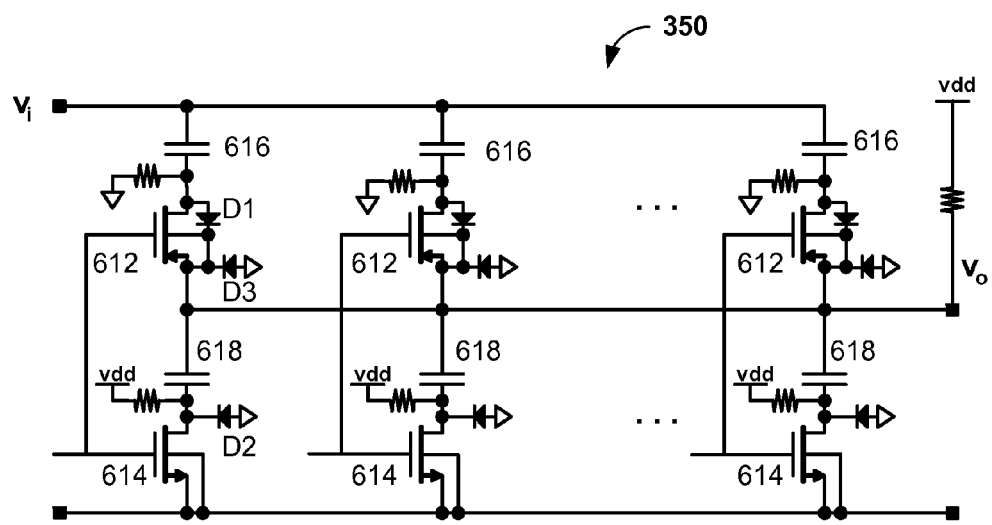
FIG. 6 illustrates another example MOSFET capacitive voltage divider having pull-up/down structure to bias junction diodes.

FIG. 6 illustrates an example MOSFET capacitive voltage divider 350 configured in accordance with the apparatus and methods described herein. Similar to the example of FIG. 5, the example capacitive voltage divider illustrated in FIG. 6 uses MOSFETs 612, 614 to switch capacitors 616, 618 in and out of a capacitor bank comprising combinations of the capacitors 616, 618. As illustrated in FIG. 6, the p-n junction diodes D1, D3, D2 formed by the p-type and n-type material of the MOSFETs are reverse-biased when the MOSFETs 612, 614 are off, avoiding the non-linearity of the diode D1, D3, D2 whenever the MOSFET 612, 614 is off and limiting the effects of these non-linearities in the capacitive voltage divider due to the non-linear capacitance of each diode D1, D3, D2. Similar to FIG. 5, the junction diodes D1, D3 in the PMOS MOSFETs 612 are not reverse-biased when the PMOS MOSFETs 612 are on, however. Accordingly, the non-linear effects of these MOSFETS 612 can affect the capacitive voltage divider by causing non-linear capacitance changes in the input capacitance and the capacitance of the upper portion of the capacitive voltage divider, etc. Additionally, DC current flows when the MOSFETs 612, 614 are on.

Figure 7:
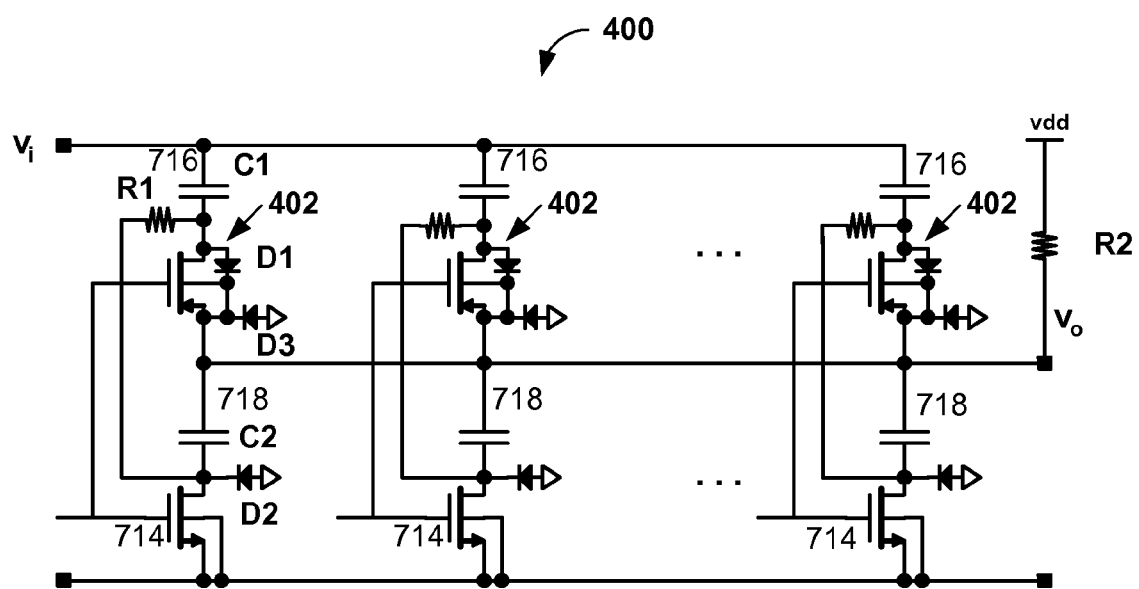
FIG. 7 illustrates an example MOSFET capacitive voltage divider configured in accordance with an embodiment of the apparatus and methods described herein.

In some embodiments, capacitor interconnects can be used to provide routing from input to output, which reduces unnecessary routing and parasitic capacitance. It also improves the accuracy of the capacitive voltage divider due to lower parasitic capacitance. For example, where parallel capacitors 616, 618 and 716, 718 are switched in and out of the divider circuit 350, 400 as illustrated in the examples of FIG. 6 or 7, all the capacitor plates connected to an input voltage $V_i$ are connected together, as are all of the capacitor plates connected to the output voltage $V_o$. The input path can be connected through one side of the divider capacitor bank's metal plates, which is used as an interconnecting metal, eliminating the need for separate interconnecting metal. This also results in less routing parasitic capacitance to the substrate and provides DC blocking from the driving stage circuitry. Accordingly, a separate DC blocking capacitor may not be required. This can also further reduce parasitic capacitance to the transistor substrate. In some embodiments, the output path of the capacitive voltage divider is DC coupled to its next stage and its next stage may provide DC bias to reverse-bias the n-well diode. This also eliminates the need for an external DC blocking capacitor to the next stage and further reduces parasitic capacitance of the substrate.

FIG. 7 illustrates an example MOSFET capacitive voltage divider 400 configured in accordance with the apparatus and methods described herein. Similar to the examples of FIGS. 5 and 6, the example capacitive voltage divider 400 illustrated in FIG. 7 uses MOSFETs 402, 714 to switch capacitors 716, 718 in and out of a capacitor bank. As illustrated in FIG. 7, the p-n junction diodes D1, D2, D3 formed between the p-type and n-type material of the MOSFETs 402, 714 are reverse-biased both when the MOSFETs 402, 714 are off and when the MOSFETs 402, 714 are on, generally avoiding the non-linearity of the diodes 706, 708, 710 and limiting the effects of these non-linearities in the capacitive voltage divider due to the non-linear capacitance of each diode 706, 708, 710. The source of each MOSFET 402, 714 is connected to the bulk of that same MOSFET 402, 714 to short out the junction diode (not shown) between them. The DC current is zero, with only dynamic current flow occurring when the NMOS and PMOS switches 402, 714 are switched on or off. The gates of one NMOS MOSFET 402 and one PMOS MOSFET 714 are tied together. Accordingly, the MOSFETs 402, 714 change in pairs. One MOSFET 402 is on while the other MOSFET 714 is off. Some overlap may occur during switching. More than one pair of MOSFETs 402, 714 may change state at the same time if multiple control inputs are changed at the same time. Each pair of one NMOS MOSFET 402 and one PMOS MOSFET 714 is considered to be one capacitive switching circuit. It will be understood by those skilled in the art that a capacitive voltage divider can be formed using just one such capacitive switching circuit or multiple such capacitive switching circuits.

In some embodiments, the source and bulk of the PMOS MOSFETs 402 are tied together to node 408 and a shared n-well is used for multiple PMOS MOSFETs 402. This can yield a decrease in the n-well area, which can decrease the junction capacitance of the diode formed between the p-substrate and the n-well. Decreases in the various junction capacitances can allow for the use of smaller capacitors in the capacitive voltage divider, which can decrease current flow in the capacitive voltage divider and allow for the use of smaller MOSFETs. Accordingly, junction capacitance can be further decreased. It will be understood by those of skill in the art that other factors may also influence the size of the MOSFETs and the capacitors in the capacitive voltage divider, thereby limiting how small the capacitive voltage divider can be made. Additional details regarding the operation of the circuit of FIG. 7 are discussed with respect to FIGS. 8 and 9. Another outcome that can be achieved by putting the sources and bulks of the PMOS MOSFETs at the output side is that the output will have a smaller voltage swing than the input side due to the dividing effect of voltage divider and results in better linearity of the capacitive divider.

In some embodiments, a resistor (not shown) may be added to each Gate of the first and second MOSFET to avoid AC signal leakage from the Drain/Source to the Gate of the first MOSFET and to the Gate and then to the Drain/Source of the second MOSFET, and vice versa.

Figure 8:
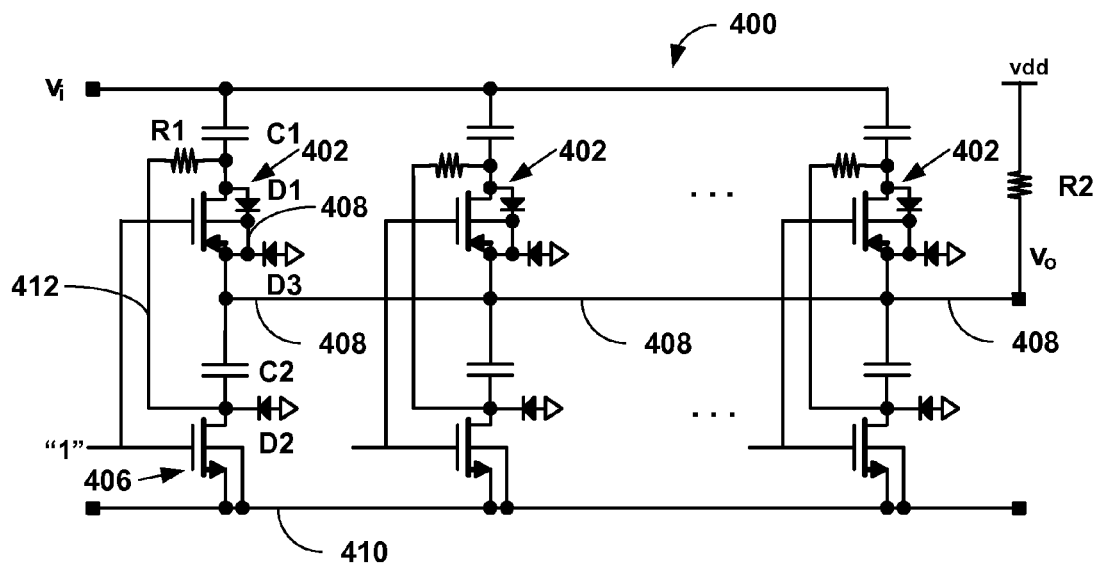
FIG. 8 illustrates the example MOSFET capacitive voltage divider of FIG. 7 with a gate input of logic "1."

FIG. 8 illustrates the example MOSFET capacitive voltage divider 400 of FIG. 7 with the gates of the MOSFETs at a logic level 1. When the gates on the MOSFETs are at a logical "1," the PMOS MOSFET 402 is off and the NMOS MOSFET 406 is on. With the PMOS MOSFET 402 off, the node 408 is pulled to $V_{dd}$, generally a high potential, by the resistor $R_2$. (In some circuits, a DC bias is provided from the next stage in the circuit, rather than a pull-up resistor). The NMOS MOSFET 406 connects node 410 to node 412, which is generally at a low potential such as, for example, ground. Accordingly, the diodes $D_1$ and $D_3$ are reversed biased and both sides of the diode $D_2$ are shorted together. In some embodiments, both sides of the diode $D_2$ are tied to ground when the gates on the MOSFETs are at a logical "1" value.

Figure 9:
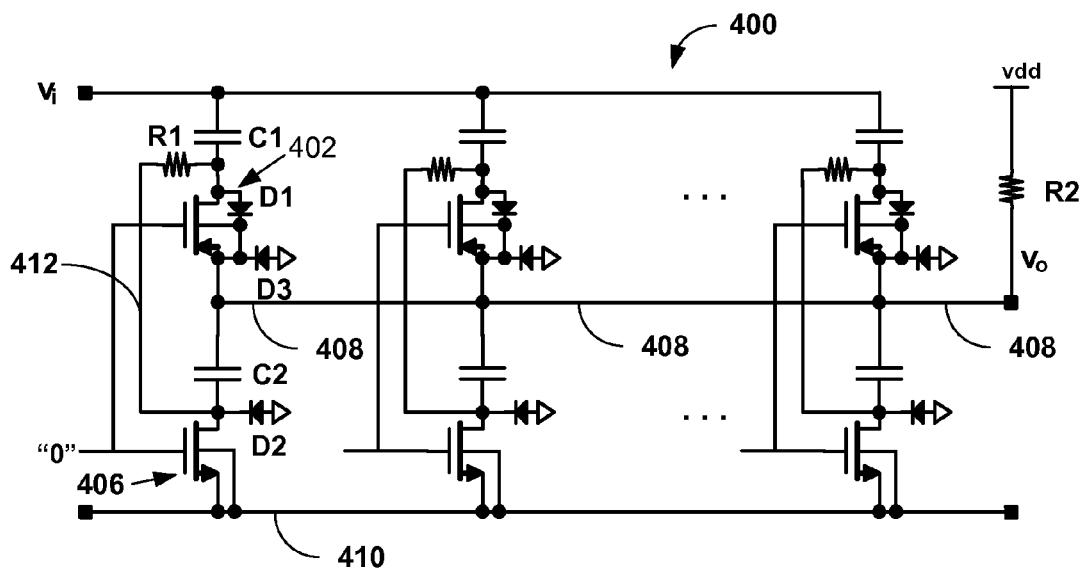
FIG. 9 illustrates an example MOSFET capacitive voltage divider of FIG. 7 with a gate input of logic "0."

FIG. 9 illustrates the example MOSFET capacitive voltage divider of FIG. 7 with the gates of the MOSFETs at a logic level 0. When the gates on the MOSFETs are at a logical "0," the PMOS MOSFET 402 is on and the NMOS MOSFET 406 is off. With the PMOS MOSFET 402 on, the nodes 408 and 412 are pulled to Vdd, generally a high potential, by the resistor $R_2$. Again, in some circuits, a DC bias is provided from the next stage in the circuit, rather than a pull-up resistor. The bulk and source of the NMOS MOSFET 406 remain connected to node 410, which is generally at a low potential, for example, ground. Accordingly, the diodes $D_2$ and $D_3$ are reversed biased and both sides of the diode $D_1$ are shorted together, generally to a high potential.

Figure 10:
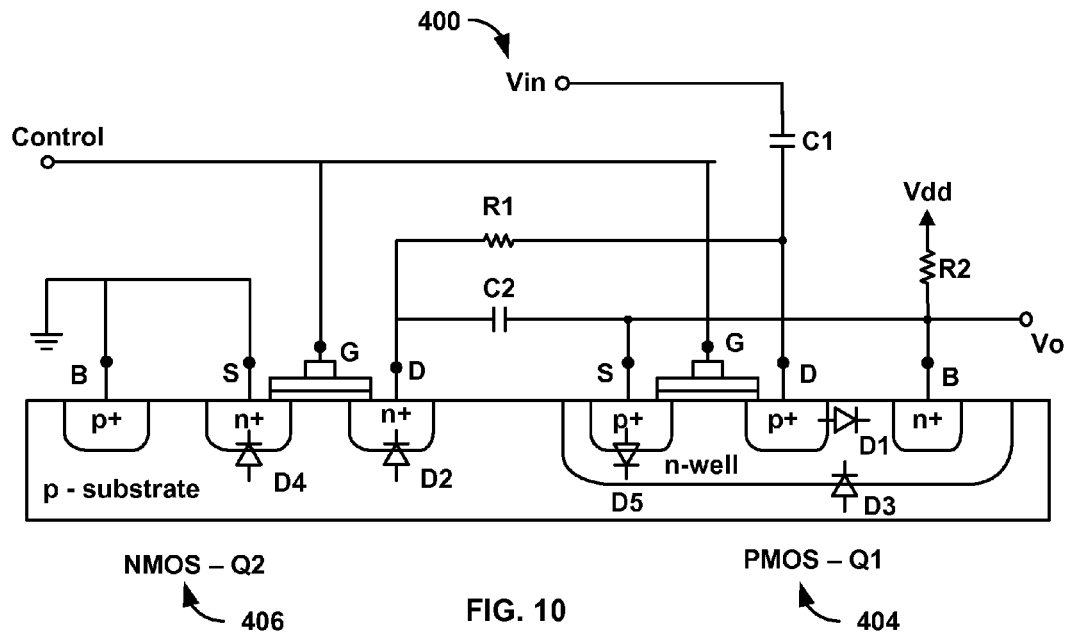
FIG. 10 illustrates an example layout for a capacitive voltage divider configured in accordance with the example of FIG. 7.

FIG. 10 illustrates an example layout for the capacitive voltage divider 400 of FIG. 7. The layout of FIG. 10 illustrates a simplified cross section of NMOS 406 and PMOS 402 MOSFETs. The circuit connections of FIG. 7 are also illustrated, including the capacitors $C_1$ and $C_2$, resistors $R_2$ and $R_1$, and the connections for $V_{in}$, $V_{out}$, and control.

A diode $D_1$ is formed between a drain and a bulk of a transistor $Q_1$, from the p-type drain through an n-type n-well in a p-substrate. In the illustrated embodiment of FIG. 10, the diode $D_1$ is reverse biased by resistors $R_2$ and $R_1$ when $Q_1$ is off. $R_1$ pulls the drain of transistor $Q_1$ low and $R_2$ pulls the bulk of transistor $Q_1$ high. Both terminals of diode $D_1$ are shorted together when $Q_1$ is on. This causes both terminals of $D_1$ to be at a high potential, pulled up by resistor $R_2$. In some embodiments, resistor $R_2$ may be replaced by circuitry in a driven stage that is coupled to the output voltage.

A diode $D_2$ is formed between the n-type drain and the p-type bulk of transistor $Q_2$, thought the p-substrate. In the illustrated embodiment of FIG. 10, when transistor $Q_2$ is on both terminals of the diode $D_2$ are tied to a low potential. Diode $D_2$ is reverse biased by resistor $R_2$ when $Q_2$ is off. In some embodiments, the diode $D_2$ is reverse biased by circuitry in a driven stage that is coupled to the output voltage.

A diode $D_3$ is formed between the n-well and the p-substrate. In the illustrated embodiment of FIG. 10, the diode $D_3$ is reverse biased by resistor $R_2$ from the bulk of transistor $Q_1$ through the bulk of transistor $Q_2$.

A diode $D_4$ is formed between the bulk and source of transistor $Q_2$. In the illustrated embodiment of FIG. 10, both terminals of the diode $D_4$ are tied to ground because the bulk and source of transistor $Q_2$ are both tied to ground.

A diode $D_5$ is formed between the source of transistor $Q_1$ and the n-well. In the illustrated embodiment of FIG. 10, the diode $D_5$ is shorted by tying the source and bulk of Q1 together to avoid creating a non-linearity.

In some embodiments, a single n-well is used for multiple PMOS MOSFETs. For example, a single n-well can be used for all PMOS MOSFETs in a capacitive voltage divider. As discussed above, using a single n-well can decrease the size of the junction capacitors for the PMOS devices in a given capacitive voltage divider 400.

Figure 11:
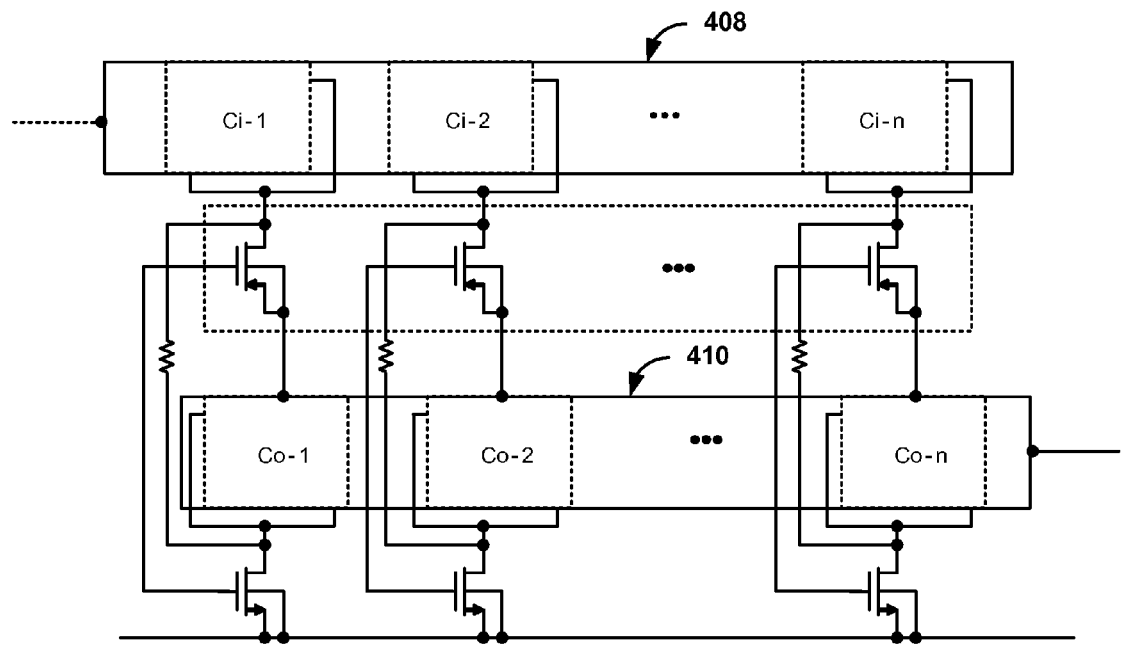
FIG. 11 illustrates an example of connecting the input and output paths through one side of the divider capacitor bank's metal plates in accordance with an embodiment of the apparatus and methods described herein.

FIG. 11 illustrates an example of connecting the input and output paths through one side of the divider capacitor bank's metal plates. The plates are used as interconnecting metal 408, 410 to the next switched capacitor, eliminating the need for separate interconnecting metal. This also results in less routing parasitic capacitance to the substrate.

Connecting the first capacitor between the input and the drain of the first MOSFET provides DC blocking from the driving stage circuitry. Accordingly, a separate DC blocking capacitor may not be required and parasitic capacitance to the substrate can be further reduced.

The DC connection of the output to the capacitive divider's driven stage can allow a higher potential driven stage to provide the required reverse bias for the n-well diode and eliminate the need for a separate pull-up resistor and DC blocking capacitor. This can further reduce parasitic capacitance to substrate.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical, or physical partitioning and configurations can be implemented to implement the desired features of the disclosed method and apparatus. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various embodiments and implementations, it should be understood that the various features, aspects, and functionality described in one or more of the individual embodiments are not limited in their applicability to the particular embodiment with which they are described. Thus, the breadth and scope of the claimed invention should not be limited by any of the above-described embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. Indeed, any or all of the various components described, whether control logic or other components, can be combined in a single package or separately maintained and can further be distributed in multiple groupings or packages or across multiple locations.

Additionally, the various embodiments set forth herein are described in terms of block diagrams, flow charts and other illustrations which are mere examples of the disclosed embodiments. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A capacitive voltage divider having an input and an output, the capacitive voltage divider comprising:
   a) a first metal-oxide-semiconductor field-effect transistor (MOSFET) having a bulk, drain and source and having the source and bulk electrically connected to the capacitive voltage divider output;
   b) a first capacitor having a first terminal coupled to the drain of the first MOSFET and a second terminal coupled to the input of the capacitive voltage divider;
   c) a first circuit coupled to the drain of the first MOSFET, the first circuit configured to apply a reverse bias to a first junction diode internal to the first MOSFET when the first MOSFET is off, the first junction diode being formed between the drain and the bulk of the first MOSFET;
   d) a second MOSFET having a bulk, drain and source and having the source and bulk electrically connected to a low potential reference level;
   e) a second capacitor having first and second terminals, the first terminal of the second capacitor coupled to the source of the first MOSFET and the second terminal of the second capacitor coupled to the drain of the second MOSFET; and
   f) a second circuit, configured to reverse bias a second junction diode between the drain and bulk of the second MOSFET when the second MOSFET is off.

2. The capacitive voltage divider of claim 1, wherein the first circuit comprises a first resistor and the second circuit comprises a second resistor.

3. The capacitive voltage divider of claim 1, wherein the first circuit comprises a first resistor and the second circuit comprises circuitry in another circuit stage.

4. The capacitive voltage divider of claim 1, wherein the first circuit is configured to short the first junction diode in the first MOSFET when the first MOSFET is on.

5. The capacitive voltage divider of claim 1, wherein the second circuit is configured to short the first junction diode in the second MOSFET when the second MOSFET is on.

6. The capacitive voltage divider of claim 1, wherein the first MOSFET comprises a p-channel MOSFET and the second MOSFET comprises an n-channel MOSFET.

7. The capacitive voltage divider of claim 6, wherein the well comprises an n-well.

8. The capacitive voltage divider of claim 1, wherein one MOSFET is formed in a well of material that is opposite in type to the substrate material.

9. The capacitive voltage divider of claim 1, further comprising a second switched capacitor circuit.

10. The capacitive voltage divider of claim 9, further comprising a single well of material that is opposite in type to the substrate material and wherein the well is shared by a first MOSFET and a MOSFET of a second switching circuit.

11. The capacitive voltage divider of claim 10, wherein the well comprises an n-well.

12. The capacitive voltage divider of claim 9, wherein a first capacitor in the first switch capacitor circuit and a first capacitor in the second switch capacitor circuit share a single capacitor plate.

13. The capacitive voltage divider of claim 9, wherein a second capacitor in the first switch capacitor circuit and a second capacitor in the second switch capacitor circuit share a single capacitor plate.

14. The capacitive voltage divider of claim 1, further comprising a plurality of switched capacitor circuits.

* * * * *